(12) United States Patent
Ooshima et al.

(10) Patent No.: US 7,384,595 B2
(45) Date of Patent: Jun. 10, 2008

(54) HEAT-TREATING APPARATUS AND HEAT-TREATING METHOD

(75) Inventors: Kazuhiko Ooshima, Kumamoto (JP); Yuichi Terashita, Kumamoto (JP); Momoko Shizukuishi, Tokyo (JP); Hideo Shite, Kumamoto (JP); Kousuke Yoshihara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 645 days.

(21) Appl. No.: 10/968,033

(22) Filed: Oct. 20, 2004

(65) Prior Publication Data

US 2005/0173396 A1     Aug. 11, 2005

(30) Foreign Application Priority Data

Oct. 22, 2003     (JP) .............................. 2003-361860

(51) Int. Cl.
  *F27D 11/00*     (2006.01)
(52) U.S. Cl. ...................................... 266/252; 438/758
(58) Field of Classification Search ................ 266/252, 266/249; 438/758
  See application file for complete search history.

(56) References Cited

U.S. PATENT DOCUMENTS

| | | | |
|---|---|---|---|
| 5,620,560 A | 4/1997 | Akimoto et al. | |
| 6,097,005 A | 8/2000 | Akimoto | |
| 6,246,030 B1 | 6/2001 | Matsuyama | |
| 6,462,310 B1 * | 10/2002 | Ratliff et al. | ............... 219/390 |
| 6,590,186 B2 | 7/2003 | Tanaka et al. | |
| 6,605,550 B2 | 8/2003 | Nagashima | |

* cited by examiner

*Primary Examiner*—Scott Kastler
(74) *Attorney, Agent, or Firm*—Oblon, Spivak, McClelland, Maier & Neustadt, P.C.

(57) ABSTRACT

A heat-treating apparatus comprises a table having a heating element buried therein, a plate-like target object to be processed being disposed on the table so as to be heated to a prescribed temperature, a support member for supporting the target object and movable in the vertical direction relative to the table such that the support member is moved to permit the target object supported by the support member to be disposed on the table or is moved away from the table, a cover surrounding the upper portion of the table, and a casing surrounding the lower portion of the table and combined with the cover so as to form a process chamber. When the process chamber is opened, the support member permits the target object to be housed inside the cover.

14 Claims, 8 Drawing Sheets

HEAT-TREATING APPARATUS AND HEAT-TREATING METHOD

BACKGROUND OF THE INVENTION

1. Field of the Invention

The present invention relates to a heat-treating apparatus and a heat-treating method, in which the influence given by the outer air is suppressed in taking out the heated target object to be processed from the process chamber.

2. Description of the Related Art

In general, in the manufacturing process of a semiconductor device, a circuit pattern is transferred in a reduced fashion onto a photoresist layer formed on the surface of a target object to be processed, e.g., a semiconductor wafer, by using the photolithography technology, followed by developing the transferred circuit pattern.

In the photolithography step, the surface of the unprocessed wafer is cleaned first so as to remove the dust and stains from the surface of the wafer, followed by applying a heating-drying treatment to the cleaned wafer. Then, immediately after the cooling, the dried wafer is transferred into a resist coating device so as to form a resist film by, for example, a spin coating method on the surface of the wafer. Then, the wafer is transferred into a heat-treating apparatus, and pre-baked at a prescribed temperature (about 80° C.) for a prescribed time in order to evaporate the solvent from the resist film. Further, the wafer is cooled to, for example, room temperature (23° C.) and, then, transferred into a light-exposure apparatus for application of the light-exposure.

The wafer after the light-exposure is transferred into a heat-treating apparatus for application of a baking (baking before the development) at a prescribed temperature for a prescribed time. The wafer after completion of the baking is transferred into a developing apparatus for application of a developing and, then, transferred again into the heat-treating apparatus for application of a post-baking (baking after the development) at a prescribed temperature (50 to 180° C.) for a prescribed time so as to evaporate under heating the developing solution or the like remaining on the photoresist layer after the development. Still further, the wafer is transferred into a cooling apparatus for cooling the wafer to room temperature (23° C.), i.e., for controlling the temperature, and, then, transferred into the next process step.

As described above, the wafer after a light-exposure is transferred into a heat-treating apparatus for application of a baking (baking before the development) at a prescribed temperature for a prescribed time. When it comes to a chemical amplification type resist utilizing the heat treatment, the amplification reaction proceeds nonuniformly on the surface of the wafer if the in-plane temperature of the wafer is rendered nonuniform so as to give rise to the problem that adverse effects are given to, for example, the line width forming a pattern. Likewise, if the cooling after the heating is not performed promptly, the amplification reaction proceeds so as to give rise to the problem that adverse effects are given to, for example, the line width forming a pattern on the surface of the wafer. Further, if the time to the cooling after the baking fails to be constant, an additional problem is generated that the line width is varied for each wafer.

As described above, it is important to pay careful attentions to the heat-treating processes performed both before and after the resist coating step and both before and after the developing step. It follows that it is necessary to supervise strictly the thermal history of the wafer.

BRIEF SUMMARY OF THE INVENTION

An object of the present invention is to provide a heat-treating apparatus and a heat-treating method, which permit making uniform the in-plane temperature distribution of the target object to be processed so as to improve the product yield.

According to a first aspect of the present invention, there is provided a heat-treating apparatus, comprising:

a table having a heating element buried therein, a plate-like target object to be processed being disposed on the table so as to be heated to a prescribed temperature;

a support member for supporting the target object and movable in a vertical direction relative to the table such that the support member is moved to permit the target object supported by the support member to be disposed on the table or is moved away from the table;

a cover having a ceiling plate and a side wall and surrounding an upper portion of the table; and a casing surrounding a lower portion of the table and combined with the cover so as to form a process chamber;

wherein the process chamber is opened under the state that the target object supported by the support member is housed inside the cover.

According to a second aspect of the present invention, there is provided a heat-treating apparatus, comprising:

a table having a heating element buried therein, a plate-like target object to be processed being disposed on the table so as to be heated to a prescribed temperature;

a support member for supporting the target object and movable in a vertical direction relative to the table such that the support member is moved to permit the target object supported by the support member to be disposed on the table or is moved away from the table;

a cover having a ceiling plate and a side wall and surrounding an upper portion of the table;

a casing surrounding a lower portion of the table and combined with the cover so as to form a process chamber; and a control section for controlling the opening-closing of the process chamber and for controlling the movement of the support member such that the process chamber is opened under the state that the support member permits the target object to be housed in the cover.

Further, according to a third aspect of the present invention, there is provided a heat-treating apparatus, comprising:

a table having a heating element buried therein, a plate-like target object to be processed being disposed on the table so as to be heated to a prescribed temperature;

a support member for supporting the target object and movable in a vertical direction relative to the table such that the support member is moved to permit the target object supported by the support member to be disposed on the table or is moved away from the table;

a cover having a ceiling plate and a side wall which form a housing section capable of housing the target object, and surrounding the upper portion of the table; and a casing surrounding a lower portion of the table and combined with the cover so as to form a process chamber.

In the heat-treating apparatus according to any of the first to third aspects of the present invention described above, the target object to be processed is housed inside the cover by the support member when the process chamber is opened. As a result, the direct contact of the target object with the outer air is suppressed even if the outer air flows into the process chamber so as to suppress the lowering of the temperature in the outer peripheral portion of the target object. It follows that the in-plane temperature distribution of the target object can be made uniform so as to improve the product yield.

It is desirable for the height of the side wall of the cover to be determined such that the target object supported by the support member is housed inside the cover even if the support member moves upward so as to permit the target object to be positioned at an upper position than a receiving position where the support member receives the target object from outside the process chamber.

It is also desirable for a cooling means for cooling the target object to be formed in the ceiling plate of the cover. If the target object is positioned close to or in contact with the cooling means, it is possible to cool the target object while maintaining the uniformity of the in-plane temperature distribution of the target object. Also, where the target object is positioned close to or in contact with the cooling means, it is possible to suppress the influence given by the outer air to the target object.

Further, it is desirable for the cover to have a taper in a lower end portion of an outer surface thereof. If a taper is formed in the lower end portion of the outer surface of the cover, the entry of the outer air into the inner region of the cover can be suppressed even if the outer air flows into the process chamber. As a result, it is possible to suppress the lowering of the temperature in the outer peripheral portion of the target object.

According to a fourth aspect of the present invention, there is provided a heat-treating method performed by using a heat-treating apparatus comprising:

a table having a heating element buried therein, a plate-like target object to be processed being disposed on the table so as to be heated to a prescribed temperature;

a support member for supporting the target object and movable in a vertical direction relative to the table such that the support member is moved to permit the target object supported by the support member to be disposed on the table or is moved away from the table;

a cover having a ceiling plate and a side wall and surrounding an upper portion of the table; and a casing surrounding a lower portion of the table and combined with the cover so as to form a process chamber;

the heat-treating method comprising:

heating the target object by the heating element buried in the table;

housing the target object inside the cover by allowing the support member to move upward the target object disposed on the table away from the table after the heating;

opening the process chamber by moving upward the cover and the target object or by moving downward the table and the casing after the target object is housed in the cover; and taking the target object out of the opened process chamber.

In the heat-treating method according to the fourth aspect of the present invention, the target object disposed on the table is moved upward after the heating away from the table by the support member so as to allow the target object to be housed inside the cover and, after the target object is housed inside the cover, the target object is moved upward together with the cover, or the table and the casing are moved downward so as to open the process chamber. Because of the particular construction, even if the outer air flows into the process chamber, the target object is prevented from being brought into direct contact with the outer air so as to suppress the lowering of the temperature in the outer peripheral portion of the target object. It follows that it is possible to make uniform the in-plane temperature distribution of the target object so as to improve the product yield.

Further, according to a fifth aspect of the present invention, there is provided a heat-treating method performed by using a heat-treating apparatus comprising:

a table having a heating element buried therein, a plate-like target object to be processed being disposed on the table so as to be heated to a prescribed temperature;

a support member for supporting the target object and movable in a vertical direction relative to the table such that the support member is moved to permit the target object supported by the support member to be disposed on the table or is moved away from the table;

a cover having a ceiling plate and a side wall and surrounding an upper portion of the table;

cooling means formed in the ceiling plate of the cover for cooling the target object; and a casing surrounding a lower portion of the table and combined with the cover so as to form a process chamber;

the heat-treating method comprising:

heating the target object by the heating element buried in the table;

housing the target object inside the cover by allowing the support member to move upward the target object disposed on the table away from the table after the heating such that the target object is positioned close to or in contact with the cooling means formed in the ceiling plate;

opening the process chamber by moving upward the cover and the target object or by moving downward the table and the casing after the target object is housed in the cover; and taking the target object out of the opened process chamber.

In the heat-treating method according to the fifth aspect of the present invention, the target object is housed inside the cover after the heating step such that the target object is positioned close to or in contact with the cooling means formed in the ceiling plate of the cover and, after the target object is housed in the cover, the cover and the target object are moved upward or the table and the casing are moved downward so as to open the process chamber. Because of the particular construction, even if the outer air flows into the process chamber, the target object is prevented from being brought into direct contact with the outer air so as to suppress the lowering the temperature in the outer peripheral portion of the target object. Further, since the target object is positioned close to or in contact with the cooling means, it is possible to cool the target object while maintaining the uniformity in the in-plane temperature distribution of the target object so as to suppress the influences given by the outer air to the target object. It follows that it is possible to make uniform the in-plane temperature distribution of the target object.

DETAILED DESCRIPTION OF THE INVENTION

Some embodiments of the present invention will now be described in detail with reference to the accompanying drawings. The following description covers the case where the heat-treating apparatus of the present invention is applied to a coating-developing process system of a semiconductor wafer.

Figure 1:
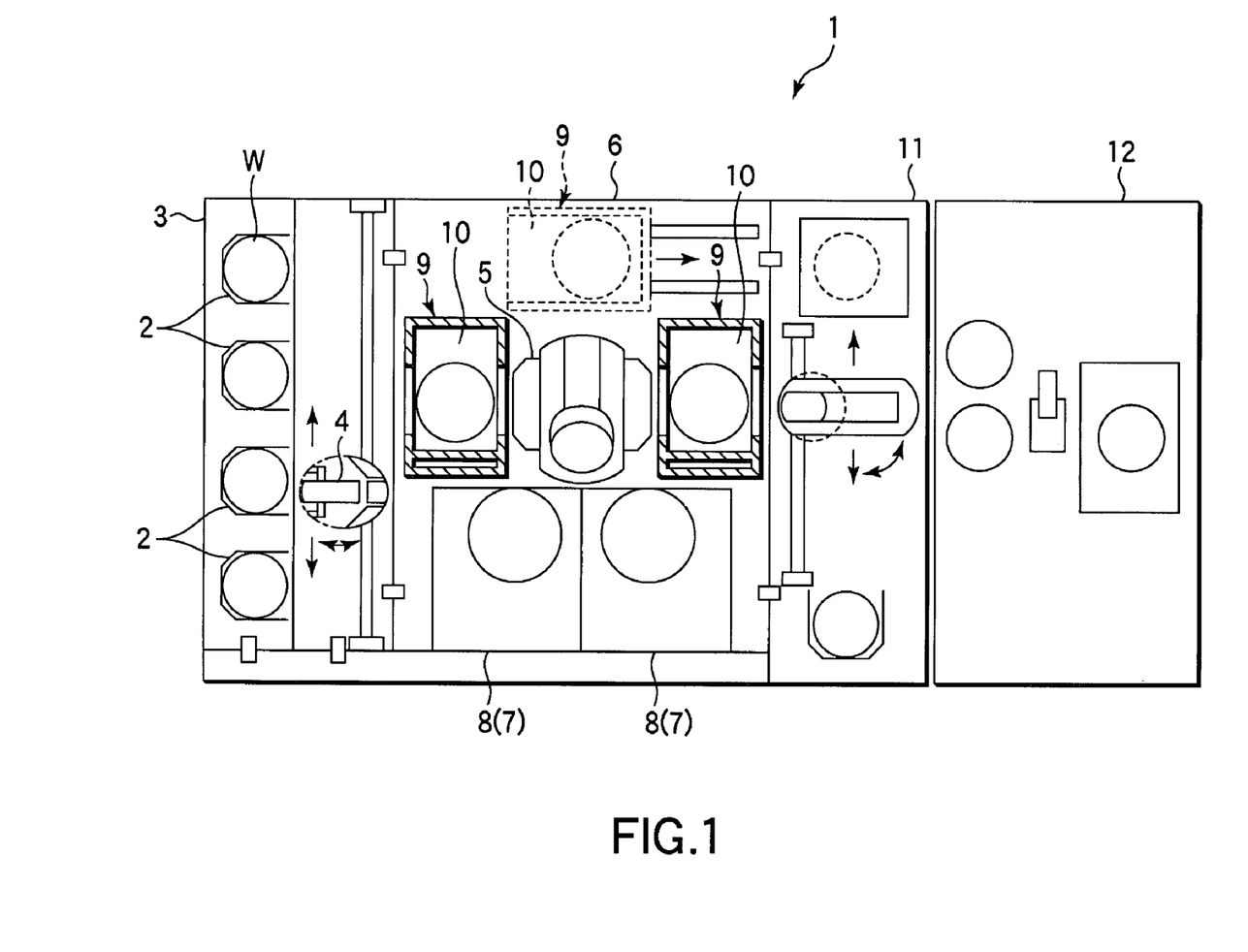
FIG. 1 is a plan view schematically showing the construction of the coating-developing process system to which the heat-treating apparatus of the present invention is applied.

FIG. 1 is a plan view schematically showing the construction of a coating-developing process system 1 of a semiconductor wafer. As shown in the drawing, a cassette block 3 is formed on one-edge side of the coating-developing process system 1. A plurality of cassettes 2, e.g., four cassettes 2, each housing, for example, a plurality of semiconductor wafers as a target object to be processed can be disposed on the cassette block 3. An auxiliary arm 4 for transferring the wafer W and for determining the position of the wafer W is formed in the central portion of the cassette block 3.

Also, a process block 6 is arranged sideward of the cassette block 3 of the coating-developing process system 1.

Further, a main arm 5 movable in the vertical direction is arranged in the central portion of the process block 6. The main arm 5 acts as a transfer means for performing the delivery of the wafer W between the main arm 5 and each process mechanism and each process apparatus within the process block 6. As shown in FIG. 1, the main arm 5 is shaped substantially like a horseshoe so as to support the peripheral portion of the wafer W.

Incidentally, various process mechanisms are arranged to form a substantially circular configuration around the main arm 5. To be more specific, the process mechanisms arranged around the main arm 5 include, for example, a resist coating mechanism 7 for coating the wafer W with a photoresist and a developing mechanism 8 for developing the photoresist layer formed on the wafer W after the light-exposure. The resist coating mechanism 7 and the developing mechanism 8 are stacked one upon the other forward of the main arm 5. Also, a process apparatus group 9 is arranged sideward and rearward of the main arm 5.

In the process apparatus group 9, stacked are a cooling device (not shown) for cooling the wafer W, an adhesion device (not shown) for enhancing the adhesion properties between the photoresist solution and the wafer W, an extension device (not shown) in which the wafer W is temporarily stored, and a heat treating device 10 for evaporating the solvent remaining inside the photoresist film, for heating the wafer W after the light-exposure step, and for heating the wafer W after the developing process. These devices are stacked one upon the other in the order mentioned as viewed from the lowermost device so as to form, for example, an 8-stage stacked structure.

Incidentally, a light-exposure device 12 for exposing the photoresist film to light in a prescribed fine pattern is arranged sideward of the process block 6 with an interface block 11 interposed therebetween.

Figure 2:
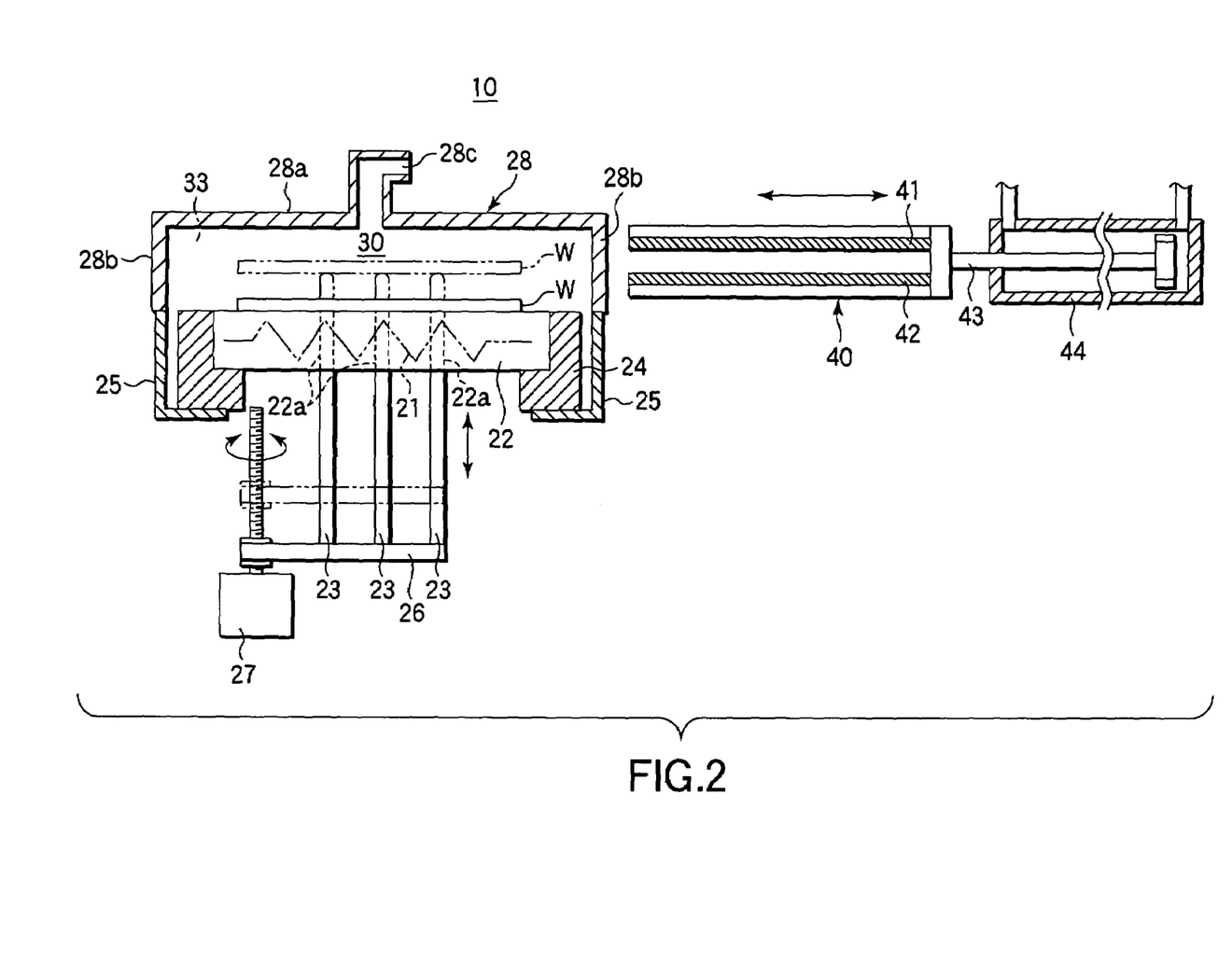
FIG. 2 is a cross sectional view schematically showing the construction of a heat-treating apparatus according to a first embodiment of the present invention.

The heat-treating apparatus will now be descried in detail with reference to FIG. 2. Incidentally, FIG. 2 is a cross sectional view schematically showing the construction of a heat-treating apparatus 10 according to a first embodiment of the present invention.

The heat-treating apparatus 10 comprises a fixed table 22 on which the wafer W is disposed. The table 22 has a heater (heating element) 21 for heating the wafer W to a prescribed temperature buried therein. The heat-treating apparatus 10 also comprises support pins 23 for supporting the wafer W and movable in the vertical direction relative to the table 22 such that the wafer W supported by the support pins 23 is allowed to be disposed on the table 22 or the wafer W is moved in the vertical direction away from the table 22.

The table 22 is held by a holding member 24, and a cylindrical casing 25 is arranged around the outer circumferential surface of the holding member 24 so as to surround the peripheral portion (lower portion) of the table 22.

Also, a cylindrical cover 28 is arranged to surround the peripheral portion (upper portion) of the table 22. The cover 28 can be moved in the vertical direction by a driving means (not shown). The vertical movement of the cover 28 can be controlled by a control means (not shown). The table 22 is surrounded by the combination of the cover 28 and the casing 25. Also, the cover 28 and the casing 25 are combined to form a process chamber 30.

The cover 28 includes a substantially circular ceiling plate 28a and a side wall 28b that is formed integral with the ceiling plate 28a. Also, the lower portion of the cover 28 is open. The free space partitioned by the ceiling plate 28a and the side wall 28b forms a housing section 33 for housing the wafer W. It is desirable for the cover 28 to be high enough to permit the wafer W to be housed temporarily in the housing section 33. In other words, it is desirable for the housing section 33 to be deep enough to permit the wafer W to be housed temporarily in the housing section 33. With increase in the height of the cover 28 or in the depth of the housing section 33, the wafer W can be disposed deeper inside the cover 28 when the process chamber 30 is opened so as to suppress more effectively the influences given by the outer air to the wafer W. More desirably, the height of the cover 28 or the depth of the housing section 33 should be set such that the wafer W held supported by the support pins 23 inside the cover 28 even if the support pins 23 move upward so as to permit the wafer W to be positioned at an upper position than a receiving position where the support pins 23 receive the wafer W from outside the process chamber 30.

It should be noted that an exhaust port 28c connected to an exhaust apparatus (not shown) is formed in the center of the ceiling plate 28a of the cover 28 so as to permit a purge gas supplied from a gas supply means (not shown) into the process chamber 30 to be discharged to the outside through the exhaust port 28c.

Also, three support pins 23 are concentrically erected from a lift plate 26 below the table 22. These support pins 23 act as a support member that can be moved in the vertical direction relative to the table 22 such that the support member supporting the wafer W can be moved to the position of the table 22 or to a position above the table 22, i.e., to be moved away from the table 22.

These support pins 23 are formed of a heat insulating material such as a ceramic material, a fluoroplastic resin or a synthetic rubber. These support pins 23 can be moved across the table 22 through a through-hole 22a formed in the table 22 in accordance with the driving of a lift mechanism 27 formed of a ball screw mechanism that is joined to the lift plate 26.

The heat-treating apparatus 10 also comprises a cooling temperature adjuster 40 for cooling the heated wafer W. The cooling temperature adjuster 40 includes an upper cooling piece 41 and a lower cooling piece 42. The upper and lower cooling pieces 41 and 42 are capable of sandwiching the wafer therebetween when the wafer W is moved to a position above the table 22 by the support pins 23. A Peltier element is buried in the upper cooling piece 41 and/or the lower cooling piece 42. By the supply of an electric power from a power source (not shown), temperature of the lower side of the upper cooling piece 41 and the upper side of the lower cooling piece 42 are reduced by endothermy so as to lower the temperature of the wafer W to a prescribed temperature, e.g., room temperature of about 23° C. Incidentally, slits (not shown) through which the support pins 23 can be inserted are formed in the lower cooling piece 42 so as to prevent the collision between the cooling temperature adjuster 40 and the support pins 23.

Also, an air cylinder 44 for the horizontal movement of the cooling temperature adjuster 40 is joined to the cooling temperature adjuster 40 via a rod 43. The cooling temperature adjuster 40 can be moved in the horizontal direction toward and away from the wafer W positioned above the table 22 by the driving of the air cylinder 44.

Incidentally, this embodiment of the present invention covers the case where the cooling temperature adjuster 40 is arranged. It is certainly desirable to arrange the cooling temperature adjuster 40. However, it is not absolutely necessary to arrange the cooling temperature adjuster 40.

A heat-treating apparatus 10' according to a second embodiment of the present invention will now be described with reference to FIG. 3. Those members of the heat-treating apparatus 10' shown in FIG. 3 which perform the functions similar to those in FIG. 2 are denoted by the same reference numerals so as to avoid the overlapping description.

Figure 3:
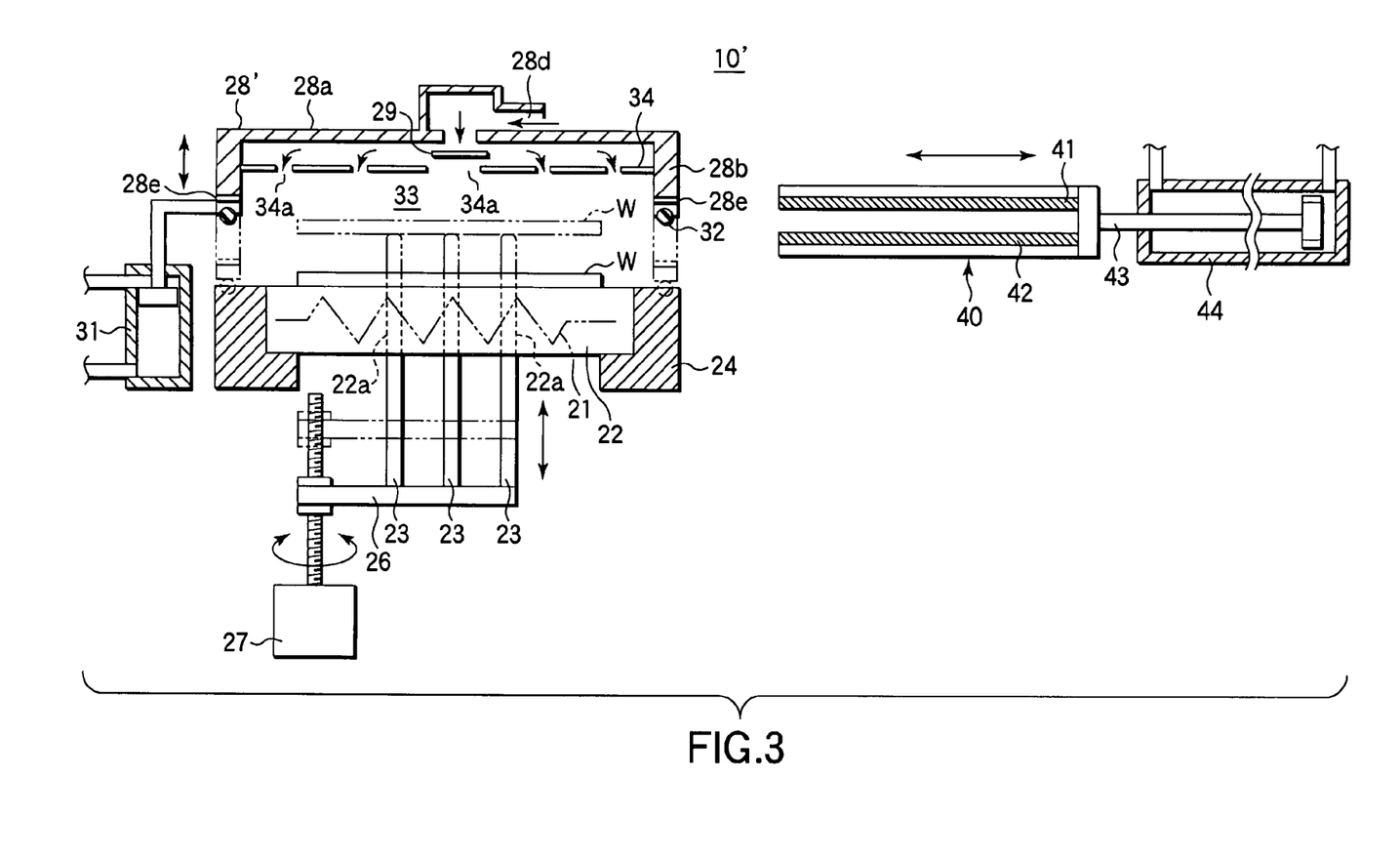
FIG. 3 is a cross sectional view schematically showing the construction of a heat-treating apparatus according to a second embodiment of the present invention.

As shown in FIG. 3, the table 22 on which the wafer W is disposed is held by the holding member 24. The table 22 has a heater (heating element) 21 buried therein for heating the wafer W to a prescribed temperature. Arranged above the table 22 and the holding member 24 are a gas inlet port 28d connected to a gas introducing device (not shown) in the central portion in the upper portion, a dispersion plate 29 for dispersing the introduced gas, e.g., air, a punched plate 34 having holes 34a for uniformly introducing the dispersed gas onto the wafer W, and a cover 28' provided with an exhaust port 28e for releasing the gas to the outside.

An O-ring 32 formed of a synthetic rubber, which is excellent in its elasticity and in its heat insulating properties, is embedded in the lower edge portion of the cover 28' in order to ensure a good contact state between the holding member 24 and the cover 28' when the cover 28' is moved downward.

Incidentally, the casing 25 as used in the heat-treating apparatus 10 shown in FIG. 2 is not arranged in the heat-treating apparatus 10' shown in FIG. 3. In the heat-treating apparatus 10' shown in FIG. 3, the cover 28' is hermetically brought into contact with the holding member 24 so as to form the process chamber 30. In other words, the holding member 24 also performs the function of the casing in the heat-treating apparatus 10' shown in FIG. 3.

In the heat-treating apparatus 10' shown in FIG. 3, the wafer W transferred by the main arm 5 is disposed on the three support pins 23, and the wafer W is disposed on the table 22 when the three support pins 23 are moved downward by the driving of the lift mechanism 27 so as to start the heat treatment applied to the wafer W.

It should be noted that the cover 28' is moved downward by the driving of the cylinder 31 simultaneously with the downward movement of the three support pins 23. As a result, the cover 28' is hermetically brought into contact with the holding member 24 so as to form the process chamber 30.

A heat-treating method using the heat-treating apparatus of the present invention described above will now be described with reference to FIGS. 4A to 4C. It should be noted that a heating method performed by using the heat-treating apparatus 10 shown in FIG. 2 is equal to a heating method performed by using the heat-treating apparatus 10' shown in FIG. 3. Such being the situation, the heat-treating method will now be described on the basis of the heat-treating apparatus 10 shown in FIG. 2. In this example, the vertical movement of the cover 28 performed by the driving of the cylinder 31 and the vertical movement of the support pins 23 performed by the driving of the lift mechanism 27 are controlled by a control section 60 acting as a control means.

Figure 4A:
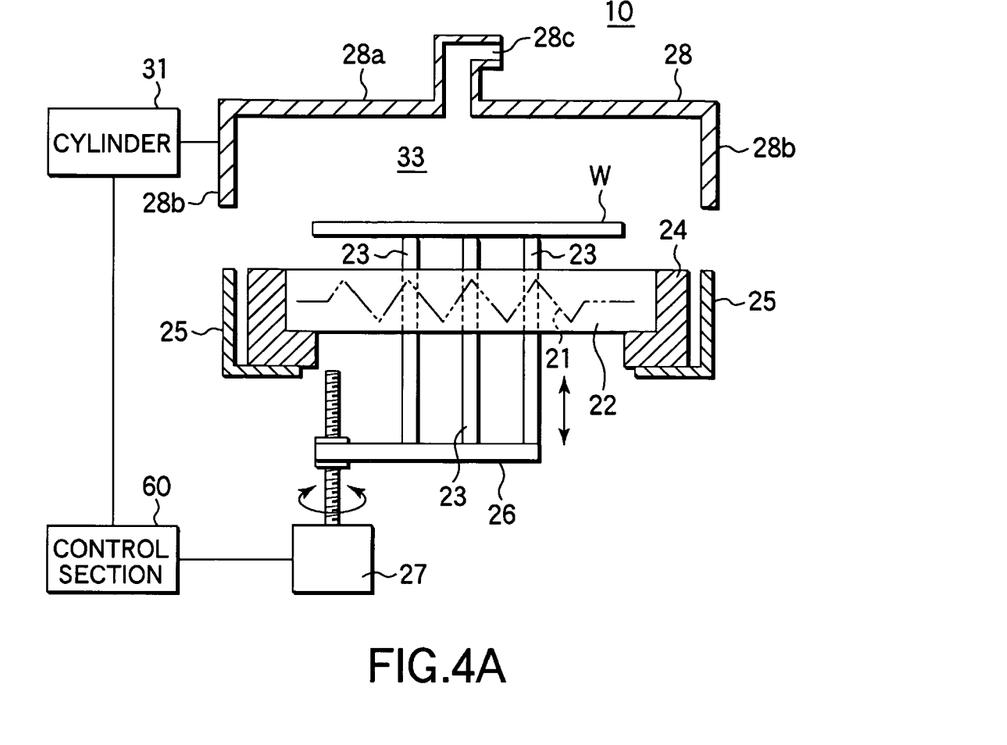
FIGS. 4A to 4C are cross sectional views collectively showing schematically the processing state of the heat-treating apparatus shown in FIG. 2.
Figure 4B:
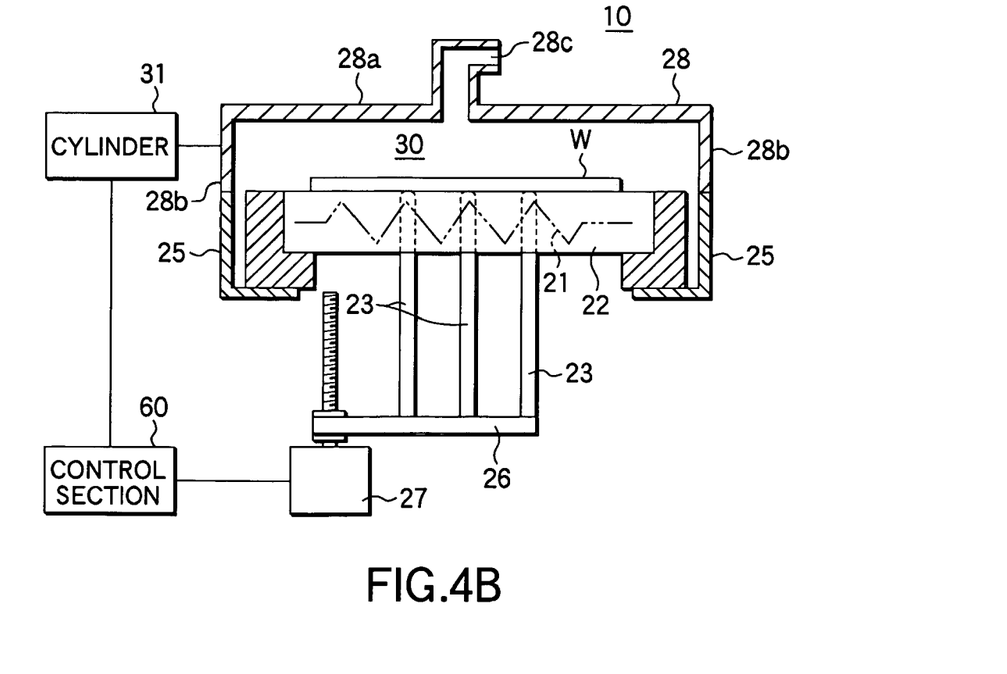

In the first step, the wafer W is disposed by the main arm 5 on the support pins 23 positioned between the lower edge portion of the cover 28 and the upper surface of the table 22, as shown in FIG. 4A. In this case, the heater 21 buried in the table 22 is turned on in advance so as to permit the temperature of the table 22 to be maintained at a prescribed level (50 to 180° C.).

Then, the support pins 23 are moved downward so as to permit the wafer W supported by the support pins 23 to be disposed on the table 22. Under this condition, the wafer W is heated for a prescribed time, as shown in FIG. 4B.

After completion of the heating step, the support pins 23 are moved upward so as to permit the wafer W supported by the support pins 23 to be housed in the inner portion (housing section 33) of the cover 28. In allowing the wafer W to be housed in the cover 28, it is desirable to move upward the wafer W to a region in the vicinity of the ceiling plate 28a of the cover 28 in order to suppress as much as possible the influence given by the inflow of the outer air to the wafer W.

Figure 4C:
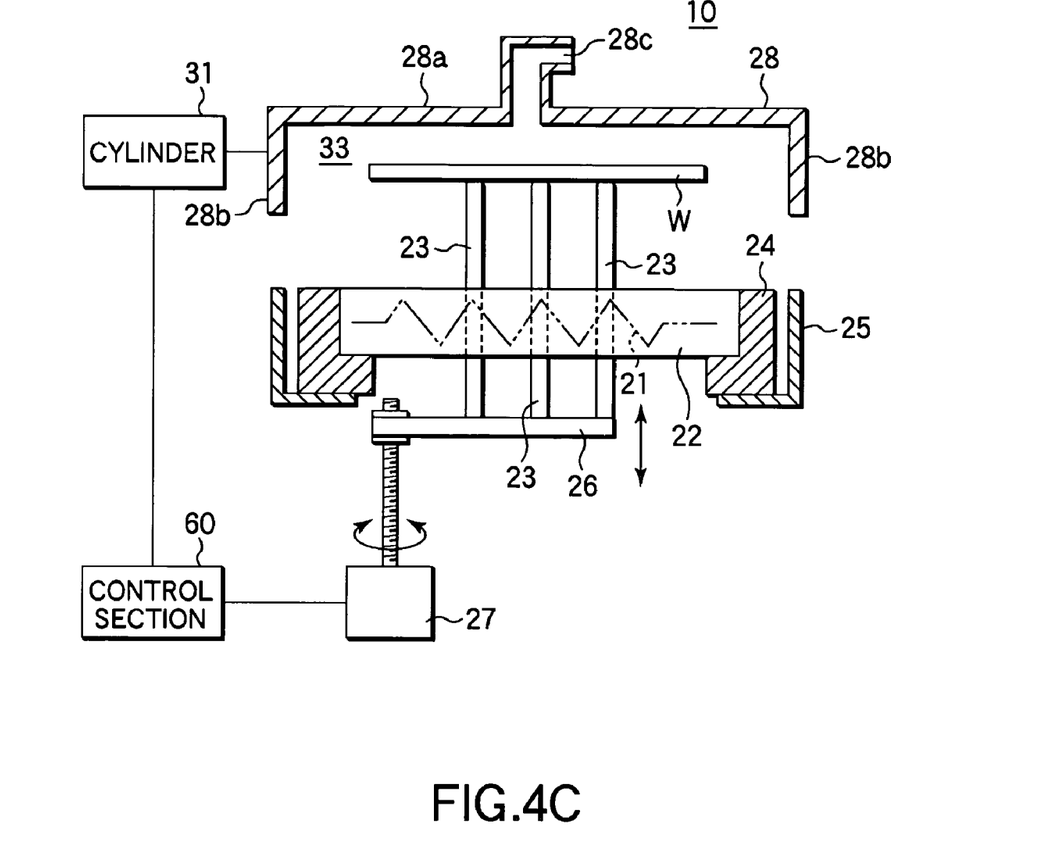

In the next step, the cover 28 is moved upward so as to open the process chamber 30, as shown in FIG. 4C. In this case, in order to suppress the influences given by the inflow of the outer air to the wafer W as much as possible, the control section 60 permits further moving upward the support pins 23 so as to move upward the cover 28 and the wafer W under the state that the wafer W is housed in the inner portion (housing section 33) of the cover 28.

A prescribed time later, the support pins 23 are moved downward so as to form the state shown in FIG. 4A. Then, the cooling temperature adjuster 40 in the waiting position as shown in FIG. 2 is moved in the horizontal direction toward the wafer W supported by the support pins 23 so as to permit the wafer W to be positioned between the upper cooling piece 41 and the lower cooling piece 42 of the cooling temperature adjuster 40. In other words, the wafer W is received by the cooling temperature adjuster 40 under the state that the upper and lower surfaces of the wafer W are covered with the upper cooling piece 41 and the lower cooling piece 42, respectively. In this case, an electric power is supplied to the Peltier element of the cooling temperature adjuster 40. Alternatively, an electric power is supplied in advance to the Peltier element for a prescribed time. Consequently, the wafer W is cooled to a prescribed temperature, e.g., room temperature of 23° C., (cooling temperature adjusting process).

Incidentally, the cooling process can be performed by using the cooling temperature adjuster 40 that does not include the upper cooling piece 41, i.e., the cooling temperature adjuster 40 consisting of the lower cooling piece 42 alone.

After completion of the cooling temperature adjustment of the wafer W, i.e., after completion of the heat treating process, the main arm 5 is inserted into a position below the wafer W supported by the support pins 23 so as to transfer the wafer W to the next process step.

As described above, after the heating step, the wafer W is housed in the inner portion, i.e., the housing section 33, of the cover 28, followed by moving upward the wafer W together with the cover 28. Then, the process chamber 30 is opened. It follows that, when the process chamber 30 is opened, the wafer W is covered with the cover 28. As a result, it is possible to suppress the inconvenience that the in-plane temperature distribution of the wafer W is rendered nonuniform, i.e., the inconvenience that the peripheral portion of the wafer W is cooled by the outer air flowing into the inner region of the process chamber 30 so as to increase the difference in temperature between the central portion and the peripheral portion of the wafer W. Also, where the heat-treating apparatus 10 is used in, for example, the baking treatment after the light exposure process, it is possible to obtain the effect that a good pattern, e.g., the line width, can be formed on the surface of the wafer W.

Incidentally, each of the first and second embodiments of the present invention described above is directed to the case where the wafer W and the cover 28 (28') are moved upward so as to open the process chamber 30 under the state that the wafer W is housed in the inner portion of the cover 28 (28'). Alternatively, it is also possible to move downward the table 22 and the casing 25 (holding member 24) so as to open the process chamber 30.

Figure 5:
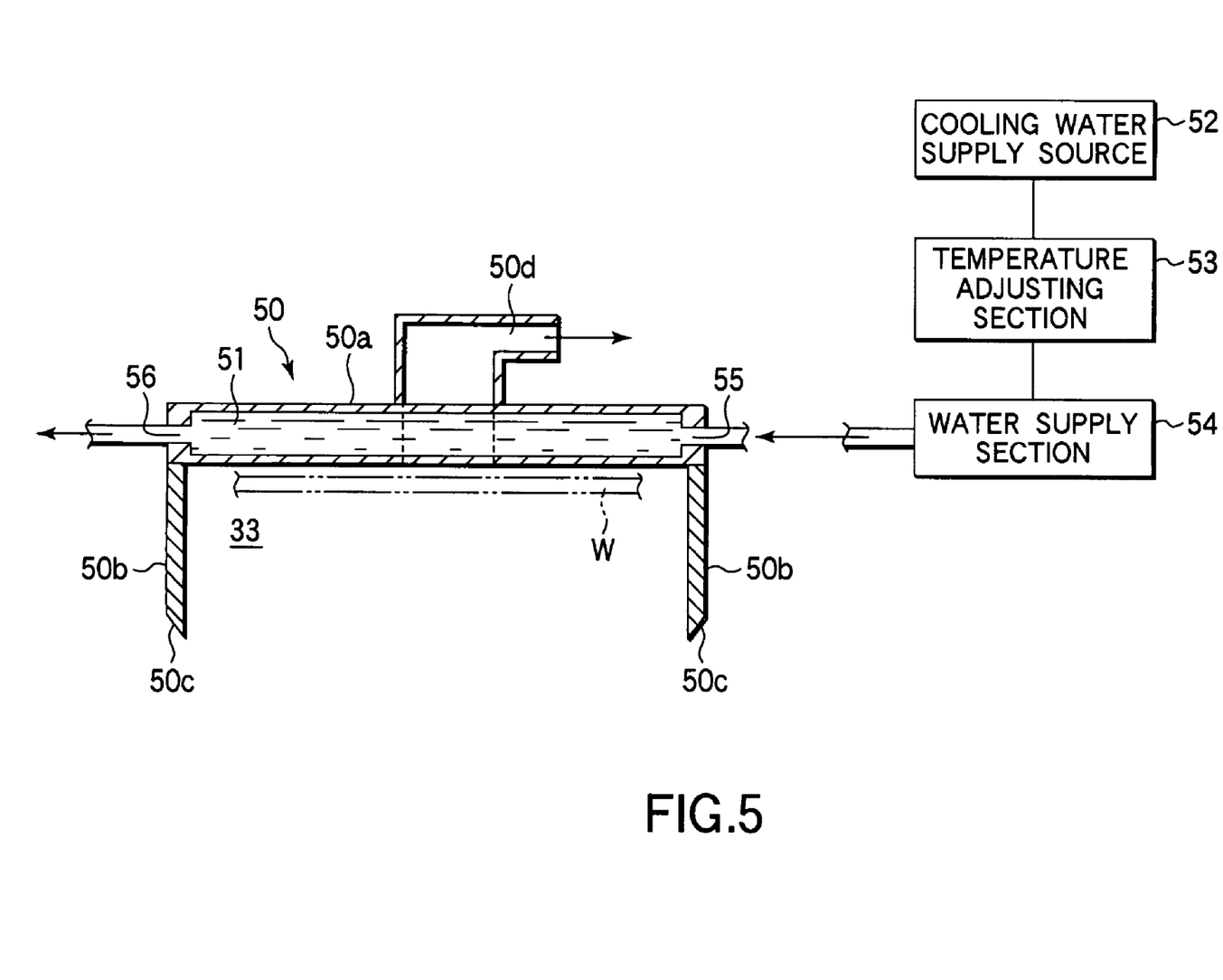
FIG. 5 is a cross sectional view schematically showing the construction of a heat-treating apparatus according to a third embodiment of the present invention.

A third embodiment of the present invention will now be described with reference to FIG. 5. Specifically, FIG. 5 schematically shows the construction of a modified cover 50. Since the construction in the other portion of the heat-treating apparatus is left unchanged, the other portion noted above is not shown in the drawing.

As shown in FIG. 5, the cover 50 is featured in that a cooling means is formed in a ceiling plate 50a. To be more specific, a fluid passageway 51 through which flows the cooling water is formed inside the ceiling plate 50a of the cover 50. The temperature of the cooling water, which is supplied from a cooling water supply source 52, is adjusted in a temperature adjusting section 53 and, then, the cooling water is supplied into the water supply section 54. Further, the temperature-adjusted cooling water is introduced through a fluid passageway inlet port 55 into the fluid passageway 51 formed inside the ceiling plate 50a of the cover 50. The cooling water flowing through the fluid passageway 51 is discharged to the outside through a fluid passageway outlet port 56. Incidentally, the cooling water is set at a high temperature, e.g., 80° C., which is higher than room temperature (normal temperature).

Also, a taper 50c is formed in the lower end portion of the outer surface of a side wall 50b included in the cover 50 so as to suppress the entry of the outer air into the inner region of the cover 50. To be more specific, since the outer air flows downward along the taper 50c, it is possible to suppress the entry of the outer air into the inner region of the cover 50. Incidentally, the construction in the lower end portion of the outer circumferential surface of the side wall 50b included in the cover 50 is not limited to the taper. It is also possible to form the construction for suppressing the entry of the outer air into the process chamber 30 when the cover 50 is moved upward. For example, it is possible to arrange a mechanism for blowing a temperature-adjusted gas, e.g., a nitrogen gas, from the side wall 50b toward the center of the process chamber 30 so as to suppress the possibility for the outer air to be brought into contact with the target object of the wafer W. Incidentally, the reference numeral 50d shown in FIG. 5 denotes an exhaust port.

As described above, a fluid passageway through which flows the cooling water is formed inside the ceiling plate 50a of the cover 50 in the third embodiment of the present invention. As a result, when the wafer W is housed in the inner portion of the cover 50, the wafer W can be positioned adjacent to or can be brought into contact with the ceiling plate 50a and, thus, the wafer W can be cooled while maintaining the uniformity of the in-plane temperature distribution of the wafer W. In addition, where the temperature of the ceiling plate 50a or the atmosphere in the vicinity of the ceiling plate 50a is higher than the temperature of the outer air, it is possible to suppress the inflow of the outer air so as to make uniform the in-plane temperature distribution of the wafer W.

Incidentally, the cooling water is used as the cooling means in the embodiment described above. However, the cooling means used in the present invention is not limited to the cooling water. Alternatively, it is also possible to use a cooling gas as the cooling means. It is also possible to form a Peltier element in the ceiling plate 50a of the cover 50 so as to cool the wafer W, thereby omitting the cooling temperature adjuster.

Figure 6A:
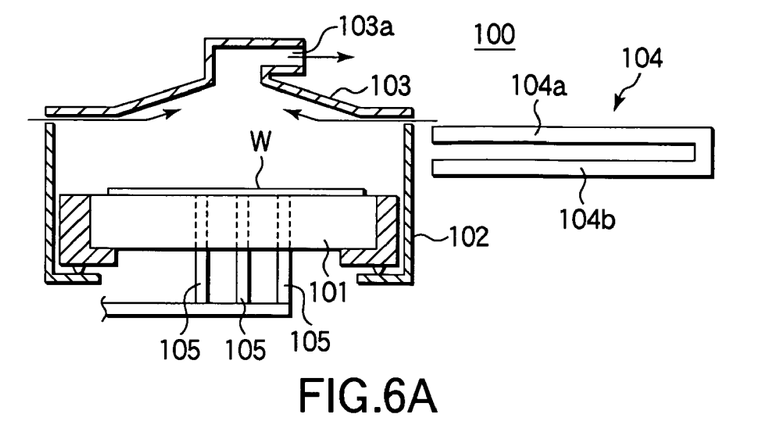
FIGS. 6A to 6C are cross sectional views collectively showing schematically the processing state of a heat-treating apparatus for a reference case.
Figure 6B:
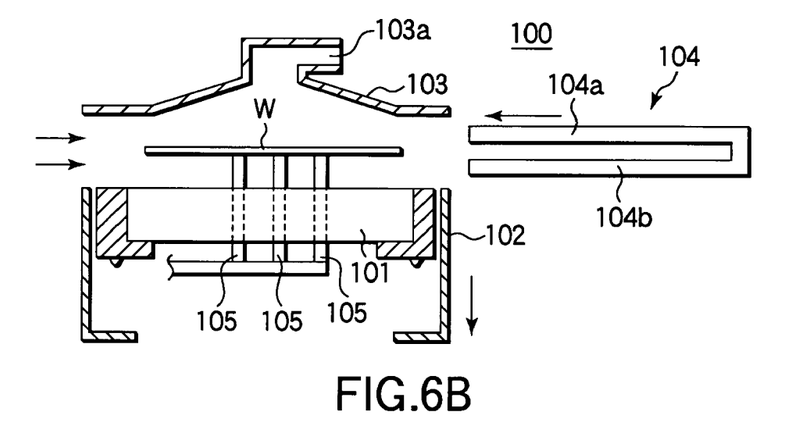
Figure 6C:
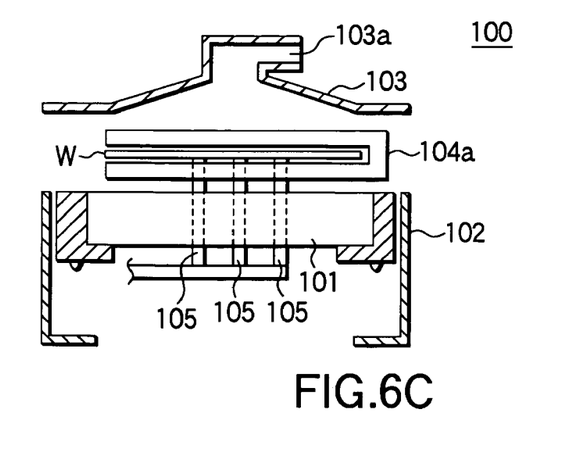

For comparison with the present invention, described in the following is the operation ranging between the heating step and the cooling step, which is carried out by using a heat-treating apparatus 100 provided with a cover that does not include a side wall for a reference case. FIGS. 6A to 6C are cross sectional views collectively showing the construction of the heat-treating apparatus 100.

As shown in FIG. 6A, a table 101 on which the wafer W is disposed is included in the heat-treating apparatus 100. The table 11 has a heating element (not shown) housed therein for heating the wafer W to a prescribed temperature. A cylindrical shutter 102 surrounding the peripheral portion of the table 101 is arranged on the outer circumferential side of the table 101. The cylindrical shutter 102 is movable in the vertical direction by a lift cylinder (not shown). Also, a cover 103 is arranged above the table 101.

When the shutter 102 is moved upward by the driving of the lift cylinder, the shutter 102 and the cover 103 collectively form a process chamber. The wafer W can be transferred onto and away from the table 101 by moving downward the shutter 102.

Three support pins 105 acting as a support member for supporting the wafer W and for transferring the wafer W onto the table 101 or onto a region above the table 101 are arranged below the table 101. These support pins 105 are capable of extending across the table 101.

The heat-treating apparatus 100 also comprises a cooling temperature adjuster 104 acting as a cooling temperature adjusting means for receiving the wafer W after the heating treatment and for cooling the heated wafer W to a prescribed temperature, e.g., room temperature (about 23° C.).

The cooling temperature adjuster 104 includes an upper cooling piece 104a and a lower cooling piece 104b. The upper and lower surfaces of the wafer W moved in the vertical direction to a position above the table 101 by the support pins 105 are sandwiched between the upper cooling piece 104a and the lower cooling piece 104b. A Peltier element is buried as a cooling medium in the upper cooling piece 104a and/or the lower cooling piece 104b. By the power supply from a power source (not shown), temperature of the lower side of the upper cooling piece 104a and the upper side of the lower cooling piece 104b are reduced by endothermy so as to cool the wafer W to a prescribed temperature, e.g., room temperature (about 23° C.).

An air cylinder (not shown) for the horizontal movement of the cooling temperature adjuster 104 is connected to the cooling temperature adjuster 104. The cooling temperature adjuster 104 can be moved in the horizontal direction toward or away from the wafer W positioned above the table 101 by the driving of the air cylinder.

A heat-treating method using the heat-treating apparatus 100 will now be described.

In the first step, the heating element buried in the table 101 is operated or is operated in advance so as to generate heat and, then, the wafer W is disposed on the table 101 by a transfer means (not shown).

Then, the wafer W is heated at a prescribed temperature (50 to 180° C.) for a prescribed time under the state that the wafer W is disposed on the table 101 as shown in FIG. 6A (heating step). In this stage, the air flowing into the process chamber through the clearance between the cover 103 and the shutter 102 is discharged to the outside through an exhaust port 103a.

After completion of the heating treatment, the support pins 105 are moved upward so as to transfer upward the wafer W to a position above the table 101 as shown in FIG. 6B (transfer step). In this step, the shutter 102 is moved downward so as to open the upper side portion of the table 101.

In the next step, the cooling temperature adjuster 104 in the waiting position is moved in the horizontal direction toward the wafer W supported by the support pins 105 as shown in FIG. 6B so as to permit the wafer W to be positioned between the upper cooling piece 104a and the lower cooling piece 104b. As a result, the upper and lower surfaces of the wafer W are sandwiched between the upper cooling piece 104a and the lower cooling piece 104b of the cooling temperature adjuster 104 so as to be covered with the cooling temperature adjuster 104 as shown in FIG. 6C. In this step, an electric power is supplied or is supplied in advance to the Peltier element buried in the cooling temperature adjuster 104 so as to cool the wafer W for a prescribed time to a prescribed temperature, i.e., room temperature of 23° C. (cooling temperature-adjusting step).

After completion of the cooling temperature adjustment, i.e., after completion of the heating treating process, a transfer means (not shown) is inserted into a position below the wafer W supported by the support pins 105 so as to transfer the wafer W to the next process step.

Figure 7:
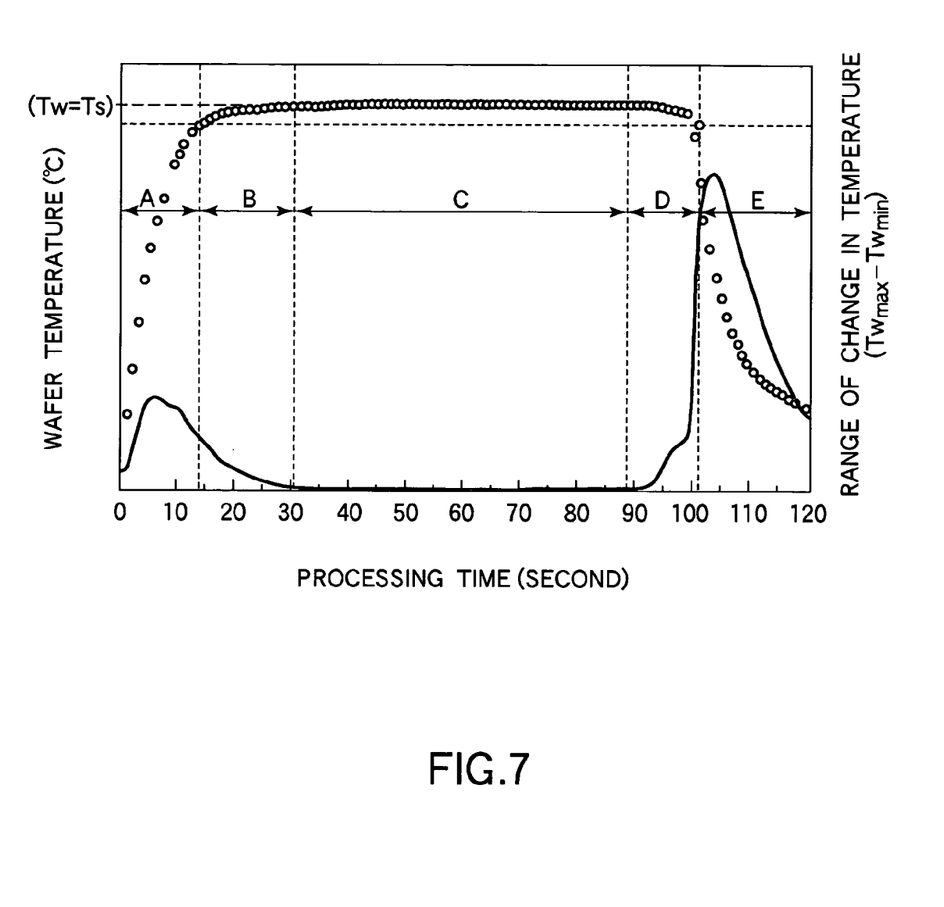
FIG. 7 is a graph showing the temperature state of the wafer.

The relationship between the temperature and the heating time (processing time) of the wafer W and the range of the change in the in-plane temperature distribution of the wafer W were obtained by using the heat-treating apparatus 100. FIG. 7 is a graph showing the experimental data. In the graph of FIG. 7, the temperature of the table 101 is denoted by Ts, the change in the wafer temperature Tw is denoted by white circles, and the difference between the highest temperature and the lowest temperature of the wafer surface, i.e., a so-called range of the temperature change $Tw_{max}-Tw_{min}$, is denoted by a solid line. Incidentally, the range of the temperature change $Tw_{max}-Tw_{min}$, plotted on the ordinate on the right side in FIG. 7 is denoted in a standardized expression. Also, room temperature (wafer temperature before the treatment) is set at 23° C.

As apparent from FIG. 7, the temperature of the wafer W put under room temperature of 23° C. is gradually elevated if the wafer W is put on the table 101 (region A shown in FIG. 7) so as to reach region B in which the wafer temperature Tw is equal to the temperature Ts of the table 101 (Tw=Ts). Then, the temperature of Tw=Ts is maintained (region C), and the temperature begins to be lowered if the wafer W is moved upward from the table 101 (region D). Further, the wafer temperature is rapidly lowered to reach room temperature if the wafer W is disposed on the cooling temperature adjuster (region E).

On the other hand, when it comes to the range of change in the in-plane temperature distribution of the wafer W, a particularly large nonuniformity was recognized in regions D and E. To be more specific, it has been clarified that, if the shutter 102 of the heat-treating apparatus 100 is opened, the temperature in, particularly, the outer circumferential portion of the wafer W is lowered by the entry of the outer air in regions D and E so as to make nonuniform the in-plane temperature distribution of the wafer W. Attentions should be paid in this connection to the phenomenon that the in-plane temperature distribution is rendered nonuniform in the process of change from the steady temperature of Tw=Ts to room temperature (regions D and E). The particular phenomenon implies that the process time for performing the chemical amplification reaction differs within the plane of the wafer W. It follows that, even in the heat-treating apparatus using the cooling temperature adjuster 104, an adverse effect on, for example, the line width forming a pattern on the surface of the wafer W is derived from the nonuniformity in the in-plane temperature distribution, and the particular adverse effect tends to remain unremoved. It is possible to avoid the particular situation by the heat-treating apparatus according to any of the first to third embodiments of the present invention.

In each of the embodiments described above, the technical idea of the present invention is applied to the coating-developing process system of a semiconductor wafer. Needless to say, however, it is also possible to apply the technical idea of the present invention to the heat treatment and to the cooling temperature adjustment of the semiconductor wafer in another process step and process system. Further, it is possible to apply the technical idea of the present invention to the heat treatment of a plate-like target object other than the semiconductor wafer. For example, it is possible to apply the technical idea of the present invention to the heat treatment of an FPD (flat panel display) and a mask substrate.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A heat-treating apparatus, comprising:
   a table having a heating element buried therein, a plate-like target object to be processed being disposed on a support face of the table so as to be heated to a prescribed temperature;
   a support member for supporting the target object and movable in a vertical direction relative to the support face to assist transfer of the target object relative to the support face;

a cover having a ceiling plate and a side wall and surrounding an upper portion of the table;

a casing surrounding a lower portion of the table and combined with the cover so as to form a process chamber; and a control section for controlling an opening-closing of the process chamber and for controlling the movement of the support member, wherein the control section is preset to form a first state in which the support member is positioned below the support face of the table when a heat treatment is performed on the target object placed on the support face, and form a second state in which the support member is projected upward from the support face of the table by a first distance, and separate the cover and the casing to open the process chamber, when loading/unloading of the target object relative to the process chamber is performed, and wherein the control section is preset to prepare for unloading of the target object relative to the process chamber, by forming a third state in which the support member is projected upward from the support face of the table by a second distance lager than the first distance, so as to keep a state in which the target object is present above a lower end of the side wall of the cover and thus is housed inside the cover, while separating the cover and the casing, and then returning the support member from the third state to the second state, so as to allow unloading of the target object relative to the process chamber.

2. The heat-treating apparatus according to claim 1, wherein the lower end of the side wall of the cover is positioned below an upper end of the support member in the second state with the cover and the casing coupled to each other.

3. The heat-treating apparatus according to claim 1, wherein the ceiling plate of the cover is provided with a cooler for cooling the target object.

4. The heat-treating apparatus according to claim 1, wherein the lower end of the side wall of the cover has outer surface inclined downward and inward.

5. A heat-treating method performed by using a heat-treating apparatus, comprising:

a table having a heating element buried therein, a plate-like target object to be processed being disposed on a support face of the table so as to be heated to a prescribed temperature;

a support member for supporting the target object and movable in a vertical direction relative to the support face to assist transfer of the target object relative to the support face;

a cover having a ceiling plate and a side wall and surrounding an upper portion of the table; and a casing surrounding a lower portion of the table and combined with the cover so as to form a process chamber;

the heat-treating method comprising:

forming a first state in which the support member is positioned below the support face of the table, while performing a heat treatment on the target object placed on the support face; and forming a second state in which the support member is projected upward from the support face of the table by a first distance, and separating the cover and the casing to open the process chamber, when loading/unloading of the target object relative to the process chamber is performed, wherein the method is arranged to prepare for unloading of the target object relative to the process chamber, by forming a third state in which the support member is projected upward from the support face of the table by a second distance larger than the first distance, so as to keep a state in which the target object is present above a lower end of the side wall of the cover and thus is housed inside the cover, while separating the cover and the casing, and then returning the support member from the third state to the second state, so as to allow unloading of the target object relative to the process chamber.

6. The heat-treating apparatus according to claim 1, wherein the control section is preset to prepare for unloading of the target object relative to the process chamber, by first setting the support member in the second state to house the target object inside the cover, then shifting the support member from the second state into the third state while separating the cover and the casing, and then returning the support member from the third state to the second state.

7. The heat-treating apparatus according to claim 1, wherein the support member comprises a plurality of support pins.

8. The heat-treating apparatus according to claim 1, wherein the control section is preset to operate the support member in cooperation with a transfer member, which is configured to transfer the target object between a position outside the process chamber and an upper end of the support member in the second state, so as to perform loading/unloading of the target object relative to the process chamber.

9. The heat-treating method according to claim 5, wherein the method is arranged to prepare for unloading of the target object relative to the process chamber, by first setting the support member in the second state to house the target object inside the cover, then shifting the support member from the second state into the third state while separating the cover and the casing, and then returning the support member from the third state to the second state.

10. The heat-treating method according to claim 5, wherein the method comprises operating the support member in cooperation with a transfer member, which is configured to transfer the target object between a position outside the process chamber and an upper end of the support member in the second state, so as to perform loading/unloading of the target object relative to the process chamber.

11. The heat-treating method according to claim 5, wherein the lower end of the side wall of the cover is positioned below an upper end of the support member in the second state with the cover and the casing coupled with each other.

12. The heat-treating method according to claim 5, wherein the ceiling plate of the cover is provided with a cooler for cooling the target object.

13. The heat-treating method according to claim 5, wherein the lower end of the side wall of the cover has an outer surface inclined downward and inward.

14. The heat-treating method according to claim 5, wherein the support member comprises a plurality of support pins.

* * * * *